United States Patent
Chinn

(10) Patent No.: US 8,729,981 B2
(45) Date of Patent: May 20, 2014

(54) PRECISION DELAY LINE INSTRUMENT

(75) Inventor: Victor K. Chinn, Bellevue, WA (US)

(73) Assignee: Colby Instruments, Inc., Bellevue, WA (US)

( * ) Notice: Subject to any disclaimer, the term of this patent is extended or adjusted under 35 U.S.C. 154(b) by 406 days.

(21) Appl. No.: 13/106,568

(22) Filed: May 12, 2011

(65) Prior Publication Data

US 2012/0286898 A1 Nov. 15, 2012

(51) Int. Cl.
*H01P 9/00* (2006.01)
*H01P 1/18* (2006.01)

(52) U.S. Cl.
CPC ... *H01P 9/00* (2013.01); *H01P 1/18* (2013.01)
USPC .............................................. 333/156; 333/18

(58) Field of Classification Search
USPC ........ 333/17.1, 138, 139, 140, 156, 161, 159, 333/164
See application file for complete search history.

(56) References Cited

U.S. PATENT DOCUMENTS

| | | | |
|---|---|---|---|
| 3,568,105 A * | 3/1971 | Felsenheld | 333/161 |
| 4,405,907 A * | 9/1983 | Breese et al. | 333/24.1 |
| 4,843,355 A | 6/1989 | Knorr | |
| 7,012,482 B2 * | 3/2006 | Rawnick et al. | 333/156 |
| 2002/0184588 A1 * | 12/2002 | Imark et al. | 714/741 |
| 2002/0190810 A1 * | 12/2002 | Nystrom et al. | 333/17.1 |
| 2009/0083589 A1 * | 3/2009 | Fulton et al. | 714/48 |

* cited by examiner

*Primary Examiner* — Stephen Jones
*Assistant Examiner* — Scott S Outten
(74) *Attorney, Agent, or Firm* — Jensen & Puntigam, PS

(57) ABSTRACT

Precision delay line instruments according to this disclosure may include a plurality of controller activatable delay loops of different delay length design values, and a controller configured to apply a selected delay setting by activating delay loops corresponding to the selected delay setting. The delay length design values may comprise a first set of delay lengths according to a first set of binary step values, and a second set of delay lengths according to a second set of binary step values that is offset from the first set of binary step values. Delay loops corresponding to selected delay settings may be identified in an operating data structure comprising best-fit matched combinations of delay loops that produce more accurate signal delays than one or more other combinations of delay loops.

19 Claims, 6 Drawing Sheets

PRECISION DELAY LINE INSTRUMENT

BACKGROUND

Delay line instruments function to delay and/or apply a phase shift to electronic signals. An electronic signal may be delayed and/or phase shifted by a desired amount by causing the signal to travel some additional distance that corresponds to the desired delay. For example, trombone-style delay line instruments generally operate using a first conducting section that is slidably inserted into a second conducting section, such that sliding the sections apart increases the length of a signal path, and vice versa. U.S. Pat. No. 4,843,355 describes an arrangement in which inner and outer conductors of a cable length are received within cavities having electrically conductive inner walls. The conductors are electrically coupled to the cavity walls by toroidal springs which contact the cavity walls at their outer diameter. The cables are repositioned to achieve different desired amounts of signal delay.

SUMMARY

The present disclosure describes precision delay line instruments and methods for manufacturing precision delay line instruments. Some example precision delay line instruments may comprise a plurality of controller activatable delay loops of different delay length design values. Each of the delay loops may comprise a neutral side, a delay side, and a controller activatable switch that routes a signal path to either the neutral side or the delay side. The delay length design values may comprise delay lengths according to a plurality of binary step values. In some embodiments, the delay length design values may comprise a first set of delay lengths according to a first set of binary step values, and a second set of delay lengths according to a second set of binary step values that is offset from the first set of binary step values.

A controller coupled to the plurality of delay loops may be configured to apply a selected delay setting by activating delay loops corresponding to the selected delay setting. The controller may identify the delay loops corresponding to selected delay settings in an operating data structure, such as a lookup table, which may comprise a set of selectable delay settings for the precision delay line instrument, and identifications of delay loops corresponding to each of the selectable delay settings. In some embodiments, the delay loops corresponding to at least one of, and up to all of, the selectable delay settings may comprise best-fit matched combinations of delay loops that produce more accurate signal delays than one or more other combinations of delay loops producible by the delay line instrument.

The controller may also be coupled to one or more inputs configured to receive selected delay settings, for example, a keypad and/or a data signal input such as an Ethernet port. In some embodiments, the controller may be configured to apply pre-selected delay settings in response to a received trigger signal, and the precision delay line instrument may include an external trigger interface coupled to the controller. Also, a signal input interface may be coupled to an input side of the plurality of delay loops, and a signal output interface may be coupled an output side of the plurality of delay loops.

Some example methods of manufacturing precision delay line instruments may include measuring signal delays associated with a plurality of combinations of activated delay loops, storing measurement results in a measurement results data structure, best-fit matching the signal delays in the measurement results data structure with a desired set of selectable delay settings for the precision delay line instrument, building an operating data structure for the precision delay line instrument that includes the desired set of selectable delay settings and identifications of activated delay loops from the measurement results data structure that correspond to the best-fit matched signal delays, and storing the operating data structure in a memory location accessible by the controller that is configured apply a selected delay setting by accessing the operating data structure and activating the delay loops corresponding to the selected delay setting.

Further aspects, embodiments, and features will become apparent by reference to the drawings and the following detailed description.

BRIEF DESCRIPTION OF THE DRAWINGS

Aspects of the present disclosure may be understood with reference to the accompanying drawings, which depict several embodiments in accordance with the disclosure and are not to be considered limiting of its scope.

DETAILED DESCRIPTION

Figure 1:
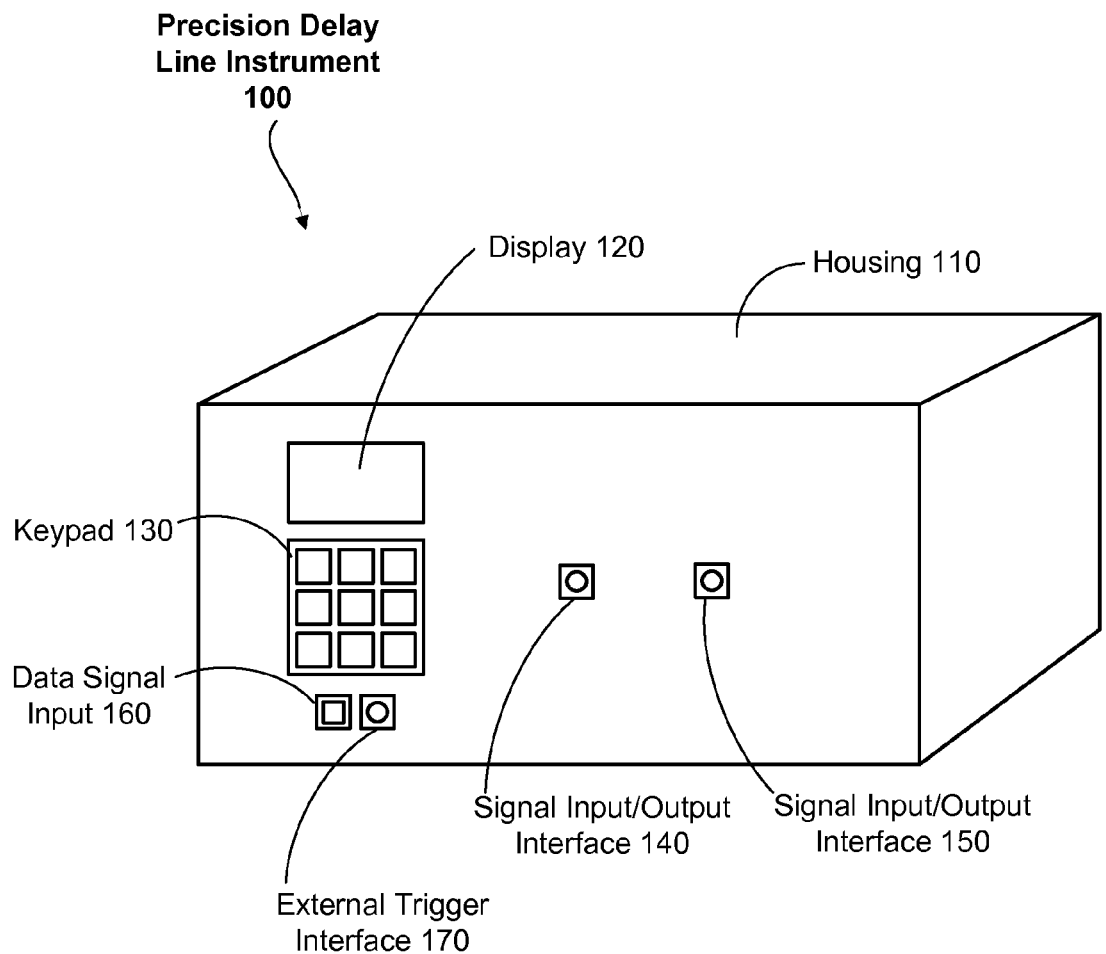
FIG. 1 illustrates an external view of an example precision delay line instrument.

In the following detailed description, reference is made to the accompanying drawings, which form a part hereof. In the drawings, similar identifiers identify similar components. The embodiments described herein are not meant to be limiting. Other embodiments may be utilized, and changes may be made, without departing from the spirit or scope of the subject matter presented here. It will be readily understood that the aspects of the present disclosure, as generally described herein, and illustrated in the drawings, may be arranged, substituted, combined, and designed in a wide variety of different configurations, all of which are explicitly contemplated and made part of this disclosure.

The present disclosure is generally drawn to precision delay line instruments and methods for manufacturing precision delay line instruments. Example precision delay line instruments may include a plurality of controller activatable delay loops of different delay length design values, and a controller configured to apply a selected delay setting by activating delay loops corresponding to the selected delay setting. In some embodiments, the delay length design values may comprise a first set of delay lengths according to a first set of binary step values, and optionally a second set of delay lengths according to a second set of binary step values that is offset from the first set of binary step values. Delay loops corresponding to selected delay settings may be identified in an operating data structure. The operating data structure may comprise one or more best-fit matched combinations of delay loops that produce more accurate signal delays than one or more other combinations of delay loops. Methods for manufacturing precision delay line instruments may include measuring signal delays associated with a plurality of combinations of activated delay loops, and best-fit matching the signal delays in the measurement results with a desired set of selectable delay settings, to build the operating data structure for the precision delay line instrument.

FIG. 1 illustrates an external view of an example precision delay line instrument. Example precision delay line instrument 100 comprises housing 110, display 120, keypad 130, signal input/output interfaces 140 and 150, data signal input 160, and external trigger interface 170.

In general, the precision delay line instrument 100 may be configured to receive a signal in one of the signal input/output interfaces 140 or 150, delay the received signal by some desired delay interval, and output the delayed signal at the other of the signal input/output interfaces 140 or 150. The precision delay line instrument 100 may be configured to receive delay setting inputs via the keypad 130 and/or the data signal input 160, and to adjust an applied delay interval according to received delay settings, as described herein. The precision delay line instrument 100 may be configured to display information, such as a current delay setting, on the display 120. The precision delay line instrument 100 may optionally also be configured to apply pre-selected delay settings in response to trigger signals received via the external trigger interface 170.

The keypad 130 and data signal input 160 are example structures through which the precision delay line instrument 100 may receive selected delay settings. Other input apparatus may be employed, for example, keyboards, mouse type selection devices, touch screens, optical recognition devices, and/or wireless communication devices may be employed in some embodiments. Data signal input 160 may be communicatively couplable with a programmable electronic device, such as a computer or other electronic device external to the precision delay line instrument 100. For example, the data signal input 160 may comprise an Ethernet port or wireless communication device. The external computer may provide one or more delay settings to the precision delay line instrument 100 via the data signal input 160, and the precision delay line instrument 100 may be configured to apply the received delay settings. The precision delay line instrument 100 may also be configured to apply delay settings received via the keypad 130 or other input apparatus.

The precision delay line instrument 100 may be configured to receive delay settings via an input apparatus such as the keypad 130 and/or data signal input 160 in the form of time interval settings and/or phase shift settings. For example, in some embodiments, the precision delay line instrument 100 may be configured to receive selected delay settings in the form of any whole number from 1 to 5120, and to adjust an applied delay interval to a corresponding number of picoseconds (ps) of delay. For example, the precision delay line instrument 100 may be configured to apply a 25 ps delay in response to receiving a 25 via the keypad 130 and/or data signal input 160.

In some embodiments, the precision delay line instrument 100 may be configured to receive selected delay settings in the form of an amount of phase shift, e.g. any whole number from 1 to 360, and to adjust an applied delay interval to a corresponding number of degrees of phase shift. For example, the precision delay line instrument 100 may be configured to apply a 25 degree phase shift in response to receiving a 25 via the keypad 130 and/or data signal input 160. In embodiments configured to receive phase-shift delay settings, the precision delay line instrument 100 may be configured to receive and/or measure signal frequency and calculate a delay interval corresponding to a received phase-shift delay setting, from the received and/or measured signal frequency.

In some embodiments, the signal input/output interfaces 140 and 150 and the external trigger interface 170 may comprise coaxial Radio Frequency (RF) connectors. For example, the interfaces 140, 150, and 170 may comprise male and/or female SubMiniature version A (SMA) connectors. It will be appreciated that any of a wide variety of signal interfaces are available, including wired and wireless interfaces, and that interfaces may also be custom designed to suit a particular purpose. The interfaces 140, 150, and 170 are not limited to any particular structure.

Figure 2:
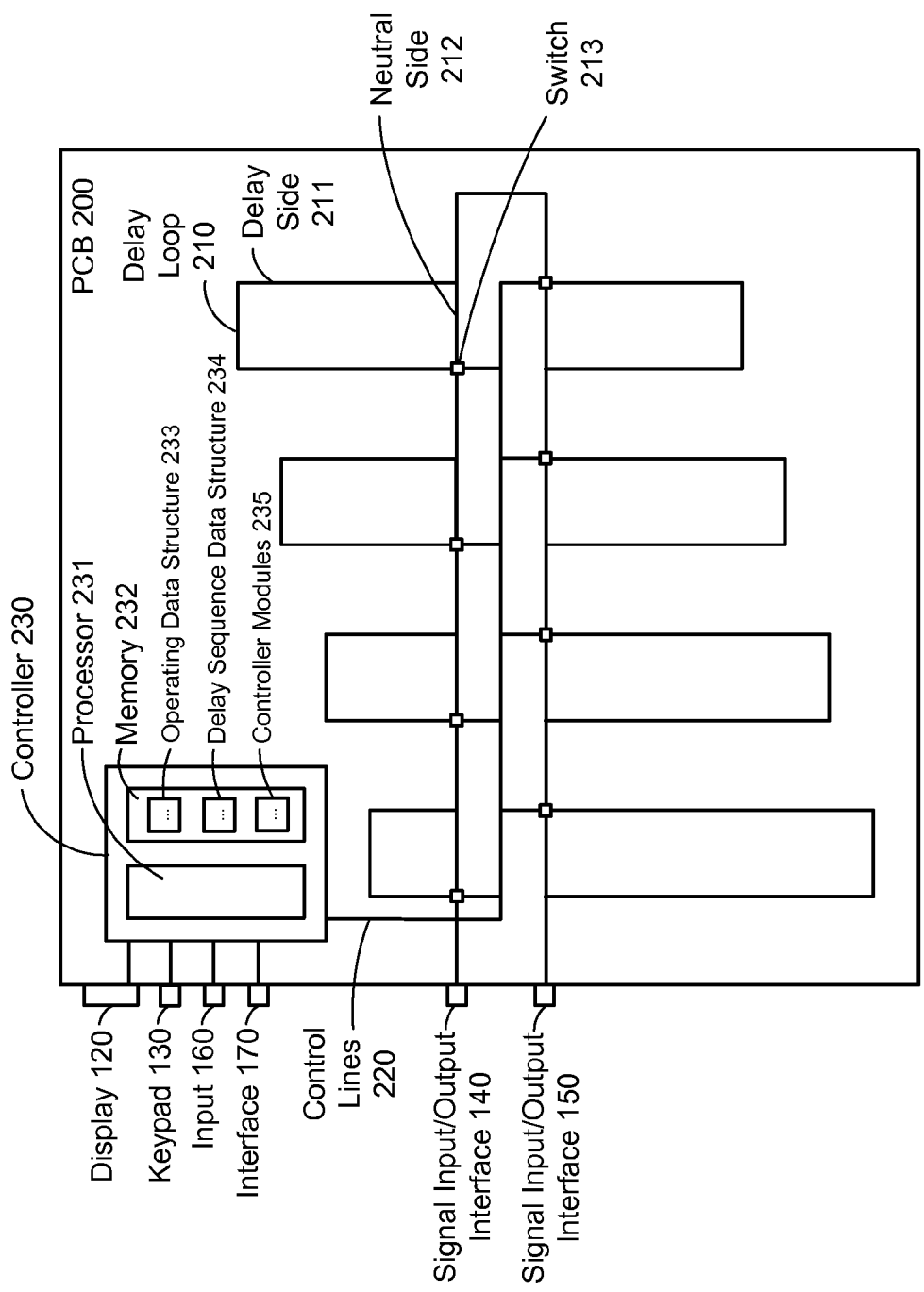
FIG. 2 illustrates an internal view of an example precision delay line instrument.

FIG. 2 illustrates an internal view of an example precision delay line instrument. FIG. 2 provides Printed Circuit Board (PCB) 200 with a plurality of delay loops along a signal path between signal input/output interfaces 140 and 150. Each of the delay loops may be configured similarly to example delay loop 210, including a delay side 211, a neutral side 212, and a switch 213. Switches such as 213 are controlled by controller 230 via control lines 220. The controller 230 is also coupled with display 120, keypad 130, data signal input 160, and external trigger interface 170. The controller 230 comprises processor 231 and memory 232. Memory 232 comprises operating data structure 233, delay sequence data structure 234, and controller modules 235.

In FIG. 2, the delay loops are activatable by the controller 230 via the control lines 220 and switches. Combinations of delay loops corresponding to each selectable delay setting provided by the precision delay line instrument 100 are stored in the operating data structure 233. Operating data structure 233 may comprise a set of selectable delay settings for the precision delay line instrument 100, and identifications of delay loops corresponding to each of the selectable delay settings. The controller 230 may be configured to receive a selected delay setting and apply the selected delay setting by accessing the operating data structure 233 and activating delay loops corresponding to the selected delay setting in the operating data structure 233. The controller 230 may also optionally be configured to apply a delay sequence from the delay sequence data structure 234, as described herein.

In some embodiments, the controller 230, delay loops, and control lines 220 may be integrated into a PCB 200. The delay loops and control lines 220 may be implemented as circuit traces on the PCB 200, and the controller 230 may be soldered or otherwise attached to the PCB 200. It will also be appreciated that embodiments need not make use of a PCB. The delay loops and control lines 220 may be made from any conductive elements, such as wire or cable segments, and the controller 230 need not be soldered to a PCB 200 in all embodiments.

The controller 230 includes a processor 231 and memory 232. The controller 230 may be implemented according to any controller architecture, and may include any number of additional structures and features that are standard controller elements and/or outside the scope of this disclosure. The controller 230 may be configured to receive inputs from input interfaces such as keypad 130, data signal input 160, and external trigger interface 170, and to generate outputs via the display 120, control lines 220, and optionally as communications to an external device via data signal input 160. The controller 230 may operate as configured by the controller modules 235, which are discussed in detail with reference to FIG. 3. In general, the controller 230 may be configured to activate a delay loop 210 by activating a switch 213 to route a signal path around the delay side 211 of the delay loop 210, and the controller 230 may be configured to deactivate a delay loop 210 by deactivating a switch 213 to route a signal path around the neutral side 212 of the delay loop 210. A combination of delay loops may be activated for example by activating all delay loops included in the combination and deactivating any delay loops that are not included in the combination.

A signal path between interface 140 and interface 150 is longer when it is routed around the delay side 211 of a delay loop 210, and a signal path is shorter when it is routed around the neutral side 212 of a delay loop 210. The operating data structure 233 may include combinations of delay loops that lengthen or shorten the signal path to lengths that produce corresponding selectable signal delays.

The delay loops may comprise a plurality of different delay length design values. A delay length design value is a delay length that a particular delay loop is designed to produce. The actual delay length of a delay loop may be different from its design value—it could be more or less that its design value. Also, a signal path within a precision delay line instrument 100 may include various delay factors attributable to the length of the neutral sides of the delay loops and/or other sources of signal delay, which may not be predicted with a desired level of precision based on the design values within the instrument 100, but may be detectable by measuring actual signal delays produced by the instrument 100.

In some embodiments, the plurality of different delay length design values may comprise delay lengths according to a plurality of binary step values, for example, 1 ps, 2 ps, 4 ps, and 8 ps delay lengths. The delay length design values may of course include more, fewer, or different binary step values.

In some embodiments, the plurality of different delay length design values may comprise multiple sets of different delay length design values. For example, the plurality of different delay length design values may comprise a first set of delay lengths according to a first set of binary step values, and a second set of delay lengths according to a second set of binary step values that is offset from the first set of binary step values. For example, the plurality of different delay length design values may comprise a first set of delay lengths including 1 ps, 2 ps, 4 ps, and 8 ps delay lengths, and a second set of delay lengths including 5 ps, 10 ps, 20 ps, 40 ps, . . . , 1280 ps, and 2560 ps delay lengths. The delay length design values of the first and/or second set may of course include more, fewer, or different binary step values. In this example, the second set of binary step values is offset because it is not within the progression that would be an extension of the values of the first set. The term "offset" does not require that the second set begins at a value falling after the first set ends, although this aspect is also a feature of the above example and may be employed some embodiments.

Figure 3:
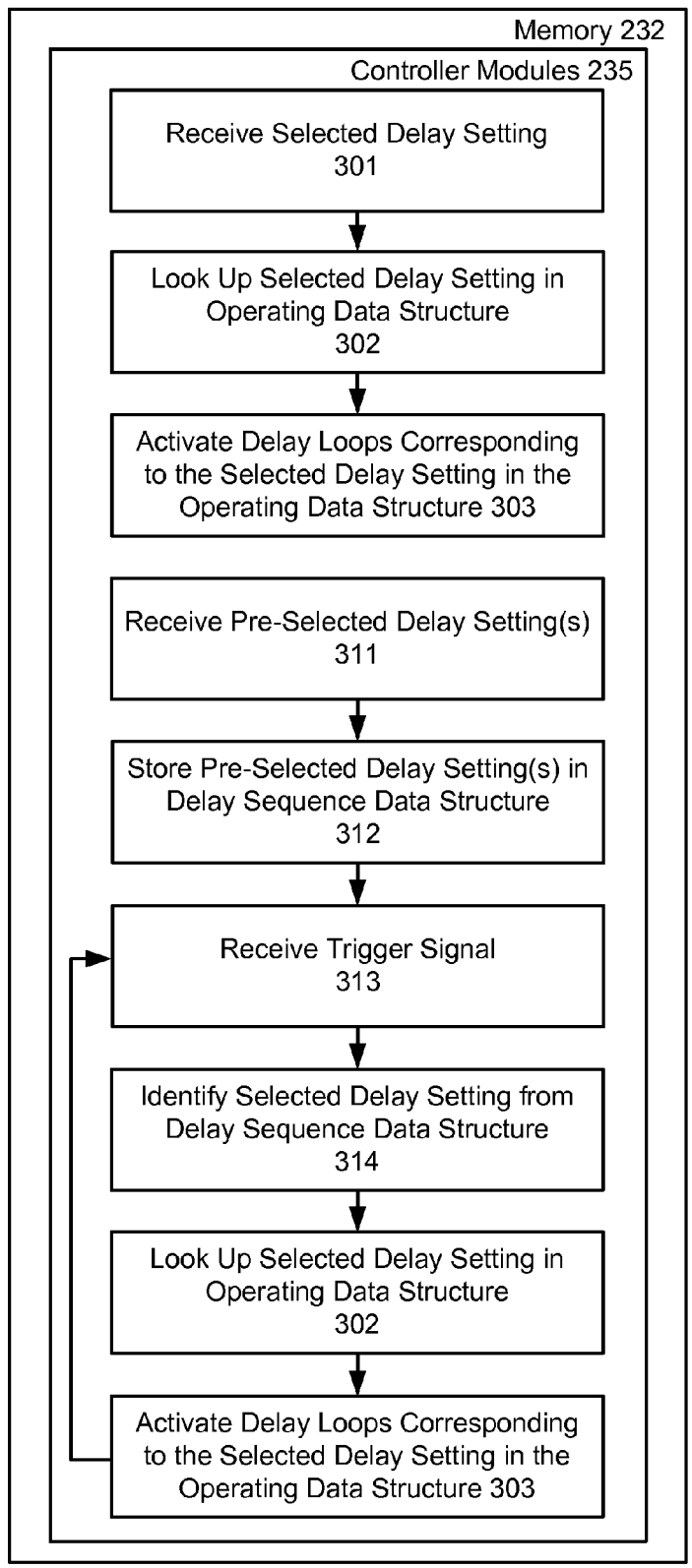
FIG. 3 illustrates example modules and operations as may be employed and/or performed by a controller in a precision delay line instrument.

FIG. 3 illustrates example modules and operations as may be employed and/or performed by a controller in a precision delay line instrument. FIG. 3 illustrates the memory 232 and example controller modules 235 stored therein. Memory 232 may comprise one or more types of memory used in the controller 230, such as cache memory, volatile memory, non-volatile memory, flash memory, hard disk memory, etc. Memory 232 may also include any additional modules and data beyond that described herein, as needed for any operations of the controller 230 which may be outside the scope of this disclosure. Each of the blocks illustrated in controller modules 235 represents a module that may be configured in a memory 232, and also represents operations that may be performed by a controller 230 in some embodiments.

The example controller modules/operations 235 include the blocks illustrated in the top set, including blocks 301-303, corresponding to operations of the precision delay line instrument 100 in a direct control mode. These include a "Receive Selected Delay Setting" block 301, a "Look Up Selected Delay Setting in Operating Data Structure" block 302, and a "Activate Delay Loops Corresponding to the Selected Delay Setting in the Operating Data Structure" block 303.

In a "Receive Selected Delay Setting" block 301, the controller 230 may be configured to receive a selected delay setting via an input such as the keypad 130 or data signal input 160. Block 301 may include one or more interactions with a user or external device. For example, in the case of receiving a selected delay setting via the keypad 130, the controller 230 may be configured to initially prompt a user via an output on the display 120 to select a delay setting. The controller 230 may be configured to receive a series of keystroke entries, and to display the keystroke entries via the display 120. The controller 230 may be configured to receive a finalization command such as when the user depresses an <ENTER> key on the keyboard 130. In response to the finalization command, the controller 230 may be configured to apply the received delay setting, e.g., by optionally storing the received delay setting in a memory location for use in block 302. Similarly, the controller 230 may be configured to receive a selected delay setting from an external device pursuant to a series of interactions with the external device in some embodiments, and the controller 230 may be configured to apply the received delay setting, e.g., by optionally storing the received delay setting in a memory location for use in block 302.

In a "Look Up Selected Delay Setting in Operating Data Structure" block 302, the controller 230 may be configured to access a memory location comprising the operating data structure 233, and the controller 230 may be configured to look up the selected delay setting received in block 301 in the operating data structure 233, using a data lookup operation. For example, in embodiments in which the operating data structure 233 is stored as a lookup table in a non-volatile memory, the controller 230 may be configured to access the operating data structure may 233 in the non-volatile memory and the controller 230 may be configured to look up the selected delay setting therein.

In an "Activate Delay Loops Corresponding to the Selected Delay Setting in the Operating Data Structure" block 303, the controller 230 may be configured to identify and activate the delay loops corresponding to the selected delay setting in the operating data structure 233. Activating a delay loop may comprise, for example, sending a switch control signal to a switch corresponding to the desired delay loop via a switch control line, wherein the switch control signal is configured to activate the switch.

In addition to activating delay loops corresponding to the selected delay setting in the operating data structure 233, in some embodiments the controller 230 may be configured to also deactivate all other delay loops. Deactivating a delay loop may comprise, for example, sending a switch control signal to a switch corresponding to the deactivated delay loop via a switch control line, wherein the switch control signal is configured to deactivate the switch.

In embodiments in which switches are implemented using one or more diodes as described in connection with FIG. 5, switch control signal(s) may apply one or more voltage(s) via one or more switch control line(s), the one or more voltage(s) forward biasing or reverse biasing one or more diodes implementing a switch. The controller 230 may be configured to bias one or more diodes implementing a switch to direct a signal path around a delay side of a delay loop to activate the delay loop. The controller 230 may be configured to bias one or more diodes implementing a switch to direct a signal path around a neutral side of a delay loop to deactivate the delay loop.

The example controller modules/operations 235 of FIG. 3 also include the blocks illustrated in the bottom set, including blocks 311-314 and 302-303, corresponding to operations of the precision delay line instrument 100 in a delay sequence mode. These include a "Receive Pre-Selected Delay Setting (s)" block 311, a "Store Pre-Selected Delay Setting(s) in Delay Sequence Data Structure" block 312, a "Receive Trigger Signal" block 313, an "Identify Selected Delay Setting from Delay Sequence Data Structure" block 314, a "Look Up Selected Delay Setting in Operating Data Structure" block 302, and a "Activate Delay Loops Corresponding to the Selected Delay Setting in the Operating Data Structure" block 303. An arrow from block 303 to block 313 in the delay sequence mode blocks indicates that the block 313-303 may be repeated each time a trigger signal is received.

In a "Receive Pre-Selected Delay Setting(s)" block 311, the controller 230 may be configured to receive one or more pre-selected delay settings via an input such as the keypad 130 or data signal input 160. As with block 301, block 311 may include one or more interactions with a user or external device.

In a "Store Pre-Selected Delay Setting(s) in Delay Sequence Data Structure" block 312, the controller 230 may be configured to store the one or more pre-selected delay settings received pursuant to block 301 in a delay sequence data structure 234. A delay sequence data structure 234 may comprise the one or more received pre-selected delay settings, wherein the one or more received pre-selected delay settings are ordered according to a desired delay sequence. In some embodiments, the controller 230 may be configured to order the pre-selected delay settings according to a sequence in which the one or more pre-selected delay settings are received. For example, a first received pre-selected delay setting may be first in the delay sequence data structure 234, a second received pre-selected delay setting may be second in the delay sequence data structure 234, and so on. Other embodiments may be configured to allow entry of sequence numbers to specify a desired delay sequence in a delay sequence data structure 234, and/or selection of sequencing protocols that automatically sequence the pre-selected delay settings within the delay sequence data structure 234. Some embodiments may further comprise one or more selectable predefined delay sequence data structures 234, and the controller 230 may be configured to support selecting from among the one or more selectable predefined delay sequence data structures 234, allowing a user of the precision delay line instrument 100 to skip the steps of entering pre-selected delay settings and sequencing information for a custom delay sequence data structure 234.

In a "Receive Trigger Signal" block 313, the controller 230 may be configured to receive a trigger signal via the external trigger interface 170. The trigger signal can be any signal. For example, the trigger signal may comprise one or more electrical pulses and/or complex waveforms if desired.

In an "Identify Selected Delay Setting from Delay Sequence Data Structure" block 314, in response to receiving the trigger signal in block 313, the controller 230 may be configured to identify a selected delay setting from the delay sequence data structure stored in block 312. The identified selected delay setting may be a next pre-selected delay setting in a sequence defined by the delay sequence data structure 234. For example, in response to a first trigger signal, the first pre-selected delay setting may be identified as a selected delay setting from the delay sequence data structure 234. In response to a second trigger signal, the second pre-selected delay setting may be identified as a selected delay setting from the delay sequence data structure 234, and so on. In some embodiments, the controller 230 may be configured to loop back to identify a first pre-selected delay setting after the last of the pre-selected delay settings in the sequence defined by the delay sequence data structure 234 is used. In some embodiments, trigger signals received after the last of the pre-selected delay settings is used may be disregarded.

In a "Look Up Selected Delay Setting in Operating Data Structure" block 302 and an "Activate Delay Loops Corresponding to the Selected Delay Setting in the Operating Data Structure" block 303, the controller 230 may be configured to carry out the operations discussed above in connection with blocks 302 and 303. The controller 230 may be configured to carry out blocks 313, 314, 302, and 303 in response to each received trigger signal, resulting in the controller 230 applying a next delay setting from the delay sequence data structure 234 each time a trigger signal is received.

Figure 4:
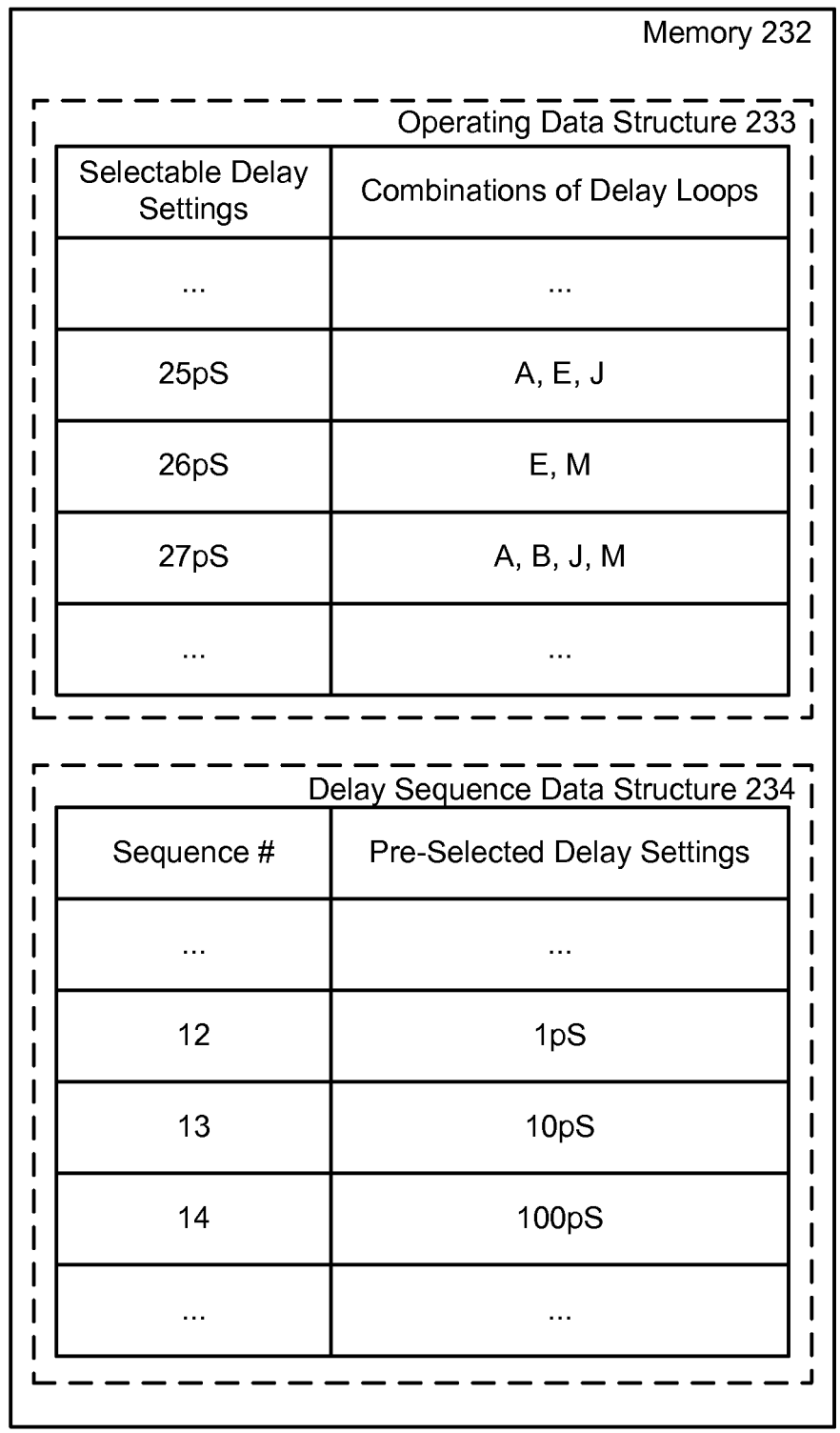
FIG. 4 illustrates a precision delay line instrument memory and example data structures therein.

FIG. 4 illustrates a precision delay line instrument memory 232 and example data structures therein, including the operating data structure 233 and delay sequence data structure 234. Example operating data structure 233 is configured as a table with selectable delay settings in a column, and corresponding combinations of delay loops in another column. In general, the combinations of delay loops comprise delay loops that, when activated, produce a signal delay in the precision delay line instrument 100 that substantially match the corresponding selectable delay settings. For example, in FIG. 4, the combination of delay loops A, E, and J produces a signal delay that substantially matches 25 ps. The combination of delay loops E and M produces a signal delay that substantially matches 26 ps. The combination of delay loops A, B, J, and M produces a signal delay that substantially matches 27 ps. The various letters identifying delay loops in operating data structure 233 correspond to delay loops in a hypothetical precision delay line instrument, which may be generally understood by assigning letters to delay loops illustrated in FIG. 2.

There are a variety of ways in which the operating data structure 233 may be configured. In some embodiments, the combinations of delay loops may be selected according to the design values of the delay loops. For example, in embodiments comprising delay loops with a first set of delay lengths including 1 ps, 2 ps, 4 ps, and 8 ps delay lengths, and a second set of delay lengths including 5 ps, 10 ps, 20 ps, 40 ps, . . . , 1280 ps, and 2560 ps delay lengths, as discussed above, a combination of delay loops corresponding to a 25 ps selectable delay setting in the operating data structure 233 may be identified as including the delay loop with a 20 ps design value, and the delay loop with a 5 ps design value. While this approach is simple, it does not always result in the highest precision, because actual delay length differs from delay length design value, and because of any stray additional sources of delay within the precision delay line instrument 100, as discussed above.

In some embodiments, at least one of, and up to all of the combinations of delay loops in the operating data structure 233 may comprise best-fit matched combinations of delay loops. In general, a best-fit matched combination of delay loops is defined herein as a combination of delay loops that, when measured, produces a signal delay by the precision delay line instrument 100 that more closely matches a selectable delay setting, as compared to other measured combinations of delay loops producible by the precision delay line instrument 100. For example, in a delay line instrument comprising delay loops A, B, C, D, E, F, G, H, I, J, K, and M, signal delays produced by one or more combinations of delay loops may be measured, e.g., the signal delay produced when A and B are activated may be measured, the signal delay produced when A and D are activated may be measured, the signal delay produced when A and D are activated may be measured, etc. The signal delay measurements produced by the measured combinations of delay loops may be compared to determine a signal delay measurement that more closely matches a selectable delay setting, e.g., 25 ps, as compared to other measured combinations of delay loops. A measured combination of delay loops corresponding to the signal delay measurement that more closely matches a selectable signal delay setting may be assigned as the combination of delay loops corresponding to the selectable signal delay setting in the operating data structure 233.

In some embodiments, a best-fit matched combination of delay loops may comprise a combination of delay loops that, when measured, produces a signal delay by the precision delay line instrument 100 that more closely matches a selectable delay setting, as compared to other measured combinations of delay loops producible by the precision delay line instrument 100, said other combinations of delay loops including a combination of delay loops selected according to delay length design values. For example, as described herein, a combination of delay loops corresponding to a 25 ps selectable delay setting may be selected according to delay length design values by selecting a delay loop with a 20 ps design value, and a delay loop with a 5 ps design value. However, such a combination may produce, for example, an actual delay that differs from 25 ps, e.g., an actual delay of 25.7 ps. Meanwhile, another combination of delay loops, e.g., a delay loop with a 20 ps design value, a delay loop with a 4 ps design value, and a delay loop with a 2 ps design value, may produce an actual signal delay by the precision delay line instrument 100 that more closely matches the selectable delay setting, e.g., may produce an actual signal delay of 25.02 ps. In this example, the 20 ps, 4 ps, and 2 ps delay loops may be included in an operating data structure 233 as a best-fit matched combination of delay loops that comprises a combination of delay loops that, when measured, produces a signal delay by the precision delay line instrument 100 that more closely matches a selectable delay setting, as compared to other measured combinations of delay loops producible by the precision delay line instrument 100 (e.g., the 20 ps and 5 ps combination), said other combinations of delay loops including a combination of delay loops selected according to delay length design values. The 20 ps, 4 ps, and 2 ps delay loops may be included in an operating data structure 233 as the delay loops to be activated for the 25 ps delay setting.

In some embodiments, a best-fit matched combination of delay loops may comprise a combination of delay loops that, when measured, produces a signal delay by the precision delay line instrument 100 that most closely matches a selectable delay setting, as compared to other measured combinations of delay loops producible by the precision delay line instrument 100. Drawing from the above example, yet another combination of delay loops, e.g., a delay loop with a 10 ps design value, a delay loop with a 8 ps design value, a delay loop with a 4 ps design value, a delay loop with a 2 ps design value, and a delay loop with a 1 ps design value, may produce an actual signal delay by the precision delay line instrument 100 that most closely matches the selectable delay setting, e.g., may produce an actual signal delay of 25.00 ps. In this example, the 10 ps, 8 ps, 4 ps, 2 ps, and 1 ps delay loops may be included in an operating data structure 233 as a best-fit matched combination of delay loops that comprises a combination of delay loops that, when measured, produces a signal delay by the precision delay line instrument 100 that most closely matches a selectable delay setting, as compared to other measured combinations of delay loops producible by the precision delay line instrument 100 (e.g., 20 ps, 4 ps, and 2 ps delay loop combination, and the 20 ps and 5 ps combination described above). The 10 ps, 8 ps, 4 ps, 2 ps, and 1 ps delay loops may be included in an operating data structure 233 as the delay loops to be activated for the 25 ps delay setting.

In the above example, the combination of the 10 ps, 8 ps, 4 ps, 2 ps, and 1 ps delay loops could have been selected according to design value, since 10+8+4+2+1=25. Nonetheless, the 10 ps, 8 ps, 4 ps, 2 ps, and 1 ps combination also produces a signal delay by the precision delay line instrument 100 that more closely matches a selectable delay setting, as compared to other measured combinations of delay loops producible by the precision delay line instrument 100, said other combinations of delay loops including a combination of delay loops selected according to delay length design values. This is because the 10 ps, 8 ps, 4 ps, 2 ps, and 1 ps combination produces a signal delay that more closely matches the 25 ps selectable delay setting than another combination of delay loops selected according to delay length design values, namely, the 20 ps and 5 ps delay loop combination, which in this example produced an actual measured signal delay of 25.7 ps. Also, it is noted that comparing a measured delay to other measured combinations of delay loops producible by a precision delay line instrument 100 does not necessarily include comparing a measured delay to all possible combinations of delay loops. Such embodiments are discussed below.

In some embodiments, a best-fit matched combination of delay loops may comprise a combination of delay loops that produces a signal delay by the delay line instrument that most closely matches a corresponding selectable delay setting, as compared to all other combinations of delay loops producible by the delay line instrument 100. This may be considered a preferred embodiment for some applications, because it achieves maximum precision of the delay line instrument. As described in connection with FIG. 6, all possible combinations of delay loops may be measured, and the combinations that most closely match the desired set of selectable delay settings for a precision delay line instrument 100 may be identified in the operating data structure 233 in the precision delay line instrument 100. Embodiments in which the operating data structure 233 comprises identified delay loops corresponding to each of the selectable delay settings that are best-fit matched as compared to all other combinations of delay loops producible by the delay line instrument 100 can achieve high levels of precision across the full range of selectable delay settings implemented in the instrument.

Example delay sequence data structure 234 may be configured to receive one or more pre-selected delay settings. For example, delay sequence data structure 234 may be configured as a table with sequence numbers in a column, and corresponding pre-selected delay settings in another column. The controller 230 may be configured to apply a pre-selected delay setting from the delay sequence data structure 234, in response to a received trigger signal. In some embodiments, the controller 230 may be configured to apply a sequence of pre-selected delay settings from the delay sequence data structure 234, in response to a sequence of received trigger signals.

The sequence numbers and pre-selected delay settings may be referenced by a controller 230 when applying a delay sequence, as described in connection with FIG. 3. When initially applying a delay sequence data structure 234, the controller 230 may enter a delay sequence mode, e.g., in response to a command received via an input from the keypad 130 or data signal interface 160. In response to a first received trigger signal, the controller 230 may be configured to go to a first sequence number in the data structure 234, to identify the corresponding pre-selected delay setting, and to then apply the corresponding delay setting by looking up the delay setting in the operating data structure 233 and activating the corresponding identified delay loops. In response to any subsequently received trigger signal, the controller 230 may be configured to go to a next sequence number in the data structure 234, to again identify the corresponding pre-selected delay setting, and to again apply the corresponding delay setting. For example, in response to a 12$^{th}$ received trigger signal, a controller 230 may be configured to go to sequence number 12 in the delay sequence data structure 234, and to apply the corresponding pre-selected delay setting, e.g., 1 ps in the example of FIG. 4. Similarly, the controller 230 may be configured to apply a 10 ps delay in response to a next (13$^{th}$) received trigger signal, a 100 ps delay in response to a next (14$^{th}$) received trigger signal, and so on.

In some embodiments, the delay sequence data structure 234 may be reconfigurable, and the controller 230 may be configured to add and/or delete rows from the data structure 234, to change the values of the pre-selected delay settings, in response to inputs received via input apparatus such as the keypad 130 and/or the data signal input 160, and to store a modified data structure 234 including the received changes. The controller 230 may also be configured to perform more complex operations, such as inverting a delay sequence data structure 234, eliminating all pre-selected delay settings from the data structure 234 that are within a certain range or of a certain type, adding intermediate-value pre-selected delay settings to the data structure 234, and/or applying a sequencing algorithm to re-sequence the pre-selected delay settings.

In some embodiments, a delay sequence data structure 234 may comprise a predefined delay sequence data structure that may or may not be reconfigurable by the operator of the precision delay line instrument 100. The predefined delay sequence data structure may include any useful predefined delay sequence, and the controller 230 may be configured to apply a selected predefined delay sequence data structure in response to a received selection of a predefined delay sequence data structure.

In some embodiments, a delay sequence data structure 234 may include additional columns to allow grouping and/or sequencing of delay sequences according to other identifiers. For example, a column for pre-selected delay setting type may be included. Some delay settings may be of type A, some of type B, and some of type C. The controller 230 may be configured to apply the delay settings of all types (A, B, and C), or only the delay settings of one or more selected types in a delay sequence.

In some embodiments, the pre-selected delay settings in the delay sequence data structure 234 may be replaced or supplemented with identifications of delay loops configured to produce the pre-selected delay settings. For example, the controller 230 may be configured to pre-fetch, from the operating data structure 233, an appropriate combination of delay loops for each pre-selected delay setting desired for the delay sequence data structure 234. When applying a delay sequence, the controller 230 may be configured to directly access the pre-fetched delay loop combinations in the delay sequence data structure 234, without the need for subsequently looking up the delay loop combinations in the operating data structure 233.

Figure 5:
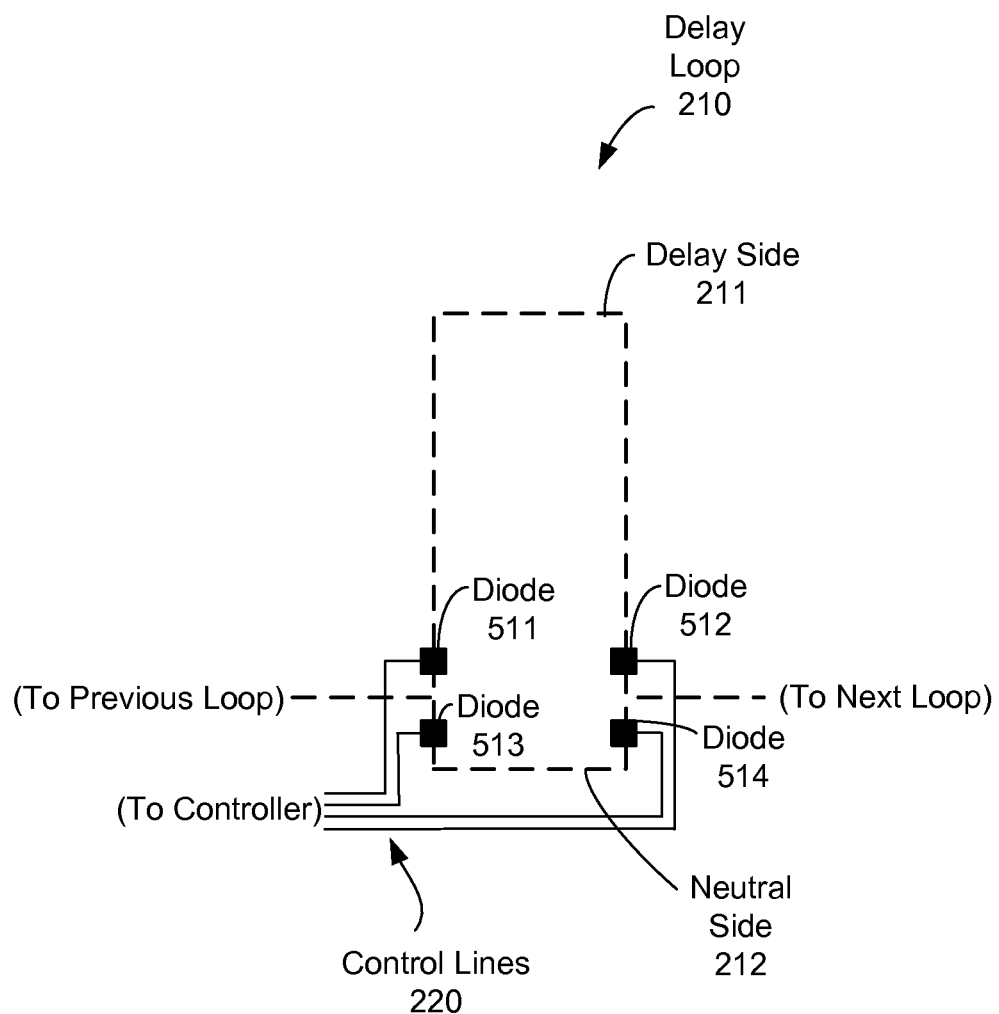
FIG. 5 illustrates an example switch configured to control a signal path within a delay loop.

FIG. 5 illustrates an example switch configured to control a signal path within a delay loop. The example switch includes diodes 511, 512, 513, and 514. Diodes 511, 512, 513, and 514 are coupled to the controller 230 via control lines 220. Diodes 511, 512, 513, and 514 may be employed to apply different switch settings, thereby routing a signal path along either the delay side 211 or the neutral side 212 of the delay loop 210.

In some embodiments, diodes 511, 512, 513, and 514 may comprise PIN and/or PN diodes, comprising p-type semiconductors and n-type semiconductors. The diodes 511 and 512 may be aligned such that forward biasing diodes 511 and 512 allows for electrical conductivity of the delay side 211, and reverse biasing diodes 511 and 512 blocks electrical conductivity of the delay side 211. Similarly, the diodes 513 and 514 may be aligned such that forward biasing diodes 513 and 514 allows for electrical conductivity of the neutral side 212, and reverse biasing diodes 513 and 514 blocks electrical conductivity of the neutral side 212. The controller 230 may be configured to forward bias and reverse bias the diodes via control lines 220 to operate the switch. For example, the controller 230 may activate the switch by forward biasing diodes 511 and 512 and reverse biasing diodes 513 and 514, and the controller 230 may deactivate the switch by forward biasing diodes 513 and 514 and reverse biasing diodes 511 and 512. The control lines 220 may be arranged in a variety of configurations, and it will be appreciated that in some embodiments, some of the control lines 220 may be merged prior to coupling to the controller 230, thereby reducing the number of connections to the controller 230.

Figure 6:
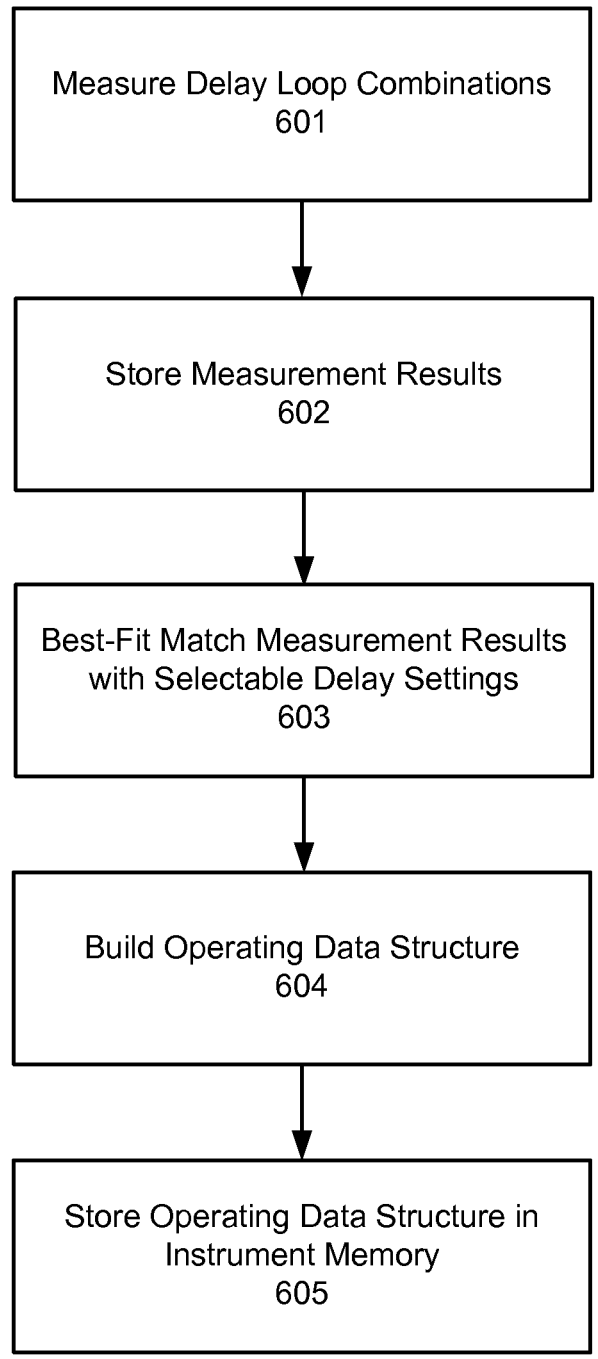
FIG. 6 illustrates example modules and operations as may be employed and/or performed in a method of manufacturing a precision delay line instrument.

FIG. 6 illustrates example modules and operations as may be employed and/or performed in a method of manufacturing a precision delay line instrument as described herein. It will be appreciated that a precision delay line instrument produced according to FIG. 6 may comprise a plurality of delay loops and a controller 230, wherein the plurality of delay loops comprises a plurality of different delay length design values, and wherein the controller 230 is configured to selectively activate the delay loops, as discussed herein. The example method includes a "Measure Delay Loop Combinations" block 601, a "Store Measurement Results" block 602, a "Best-Fit Match Measurement Results with Selectable Delay Settings" block 603, a "Build Operating Data Structure" block 604, and a "Store Operating Data Structure in Instrument Memory" block 605. Each of the blocks illustrated in FIG. 6 represents a module that may be configured in a memory of a manufacturing device configured to assist in manufacturing a precision delay line instrument 100, and also represents operations that may be performed by the manufacturing device, and/or other devices or human operators in some embodiments. The manufacturing device may generally comprise a computing device adapted to operate according to FIG. 6.

In a "Measure Delay Loop Combinations" block 601, the manufacturing device may be configured to measure a plurality of combinations of activated delay loops, wherein each combination of activated delay loops is measured by activating one or more selected delay loops and measuring a corresponding signal delay produced by the delay line instrument 100. In some embodiments, the manufacturing device may be configured measure every possible combination of delay loops within a precision delay line instrument 100. For example, in a delay line instrument comprising 14 delay loops, there are $2^{14}$ possible combinations, each of which may be measured. Each combination may be measured for example by: inputting delay loop identifiers to the controller 230; causing the controller 230 to activate the identified delay loops; providing the delay line instrument 100 with an input signal; receiving an output signal produced by the delay line instrument 100; and comparing the input and output signals to calculate a corresponding signal delay produced by the delay line instrument 100. In some embodiments, it will be appreciated that a subset of all possible combinations may be measured. Also, in some embodiments, the procedure for measuring a combination of delay loops may bypass the controller 230 by activating the delay loops directly, e.g., by connecting the manufacturing device to the control lines 220.

In a "Store Measurement Results" block 602, the manufacturing device may be configured to store measurement results in a measurement results data structure, the measurement results comprising identifications of activated delay loops included in each measured combination of activated delay loops and the corresponding signal delays produced by the delay line instrument 100. In some embodiments, block 602 may be performed alongside block 601, by storing identifications of activated delay loops included in each measured combination alongside corresponding signal delays produced by the delay line instrument 100 as each measurement is performed. In some embodiments, the measurement results data structure may comprise a two-column data structure including the identifications of activated delay loops in one column, and corresponding signal delays produced by the delay line instrument 100 in another column.

In a "Best-Fit Match Measurement Results with Selectable Delay Settings" block 603, the manufacturing device may be configured to best-fit match the signal delays in the measurement results data structure with a desired set of selectable delay settings for the precision delay line instrument 100, e.g. by determining a signal delay in the measurement results data structure that most closely matches each of the delay settings in the desired set of selectable delay settings. In some embodiments, best fit matching may be performed according to any of the best-fit matching embodiments discussed herein in connection with the operating data structure 233—for example, some embodiments may perform best fit matching on a subset of the measurement results data structure, and some embodiments may perform best fit matching for a subset of the delay settings in the desired set of selectable delay settings.

The desired set of selectable delay settings may comprise those delay settings that will be available to the operator of the completed precision delay line instrument 100, e.g., the selectable delay settings to be deployed in the operating data structure 233. They may include, for example, 5120 different delay settings, in 1 ps increments from 1 to 5120 ps.

In some embodiments, best-fit matching in block 603 may be performed by process of elimination. A delay setting in the desired set of selectable delay settings, e.g., 500 ps, may first be compared to a first signal delay in the measurement results data structure to determine a first difference value. The first difference value is then temporarily stored as a current best fit. The delay setting may then be compared to a next signal delay in the measurement results data structure to determine a next difference value. If the next difference value is smaller than the first, then the next difference value may be temporarily stored as the current best fit. This process may be repeated for each signal delay in the measurement results data structure to determine an overall best fit. The manufacturing device may be configured to store the identifications of activated delay loops corresponding to the overall best fit for the delay setting, as well as, optionally, the measured delay produced by the overall best fit combination. Information comprising measured delays produced by the overall best fit combinations may be useful in both knowing the exact delays produced by the precision delay line instrument 100, as well as knowing the average accuracy of the precision delay line instrument 100.

In a "Build Operating Data Structure" block 604, the manufacturing device may be configured to build an operating data structure 233 for the precision delay line instrument 100, the operating data structure 233 comprising the desired set of selectable delay settings for the precision delay line instrument 100, and the identifications of activated delay loops from the measurement results data structure that correspond to the best-fit matched signal delays for each of the selectable delay settings. In some embodiments, building the operating data structure according to block 604 may be performed alongside block 603, for example by storing the desired set of selectable delay settings for the precision delay line instrument 100 in the operating data structure 233, then for each of the selectable delay settings, performing best-fit matching according to block 603, and storing the identifications of activated delay loops from the measurement results data structure that correspond to the best-fit matched signal delays for each of the selectable delay settings in the operating data structure 233 as they are determined.

In a "Store Operating Data Structure in Instrument Memory" block 605, the manufacturing device may be configured to store the operating data structure 233 in a memory location accessible by the controller 230, e.g. in memory 232, wherein the controller 230 is configured apply a selected delay setting by accessing the operating data structure 233 and activating the delay loops corresponding to the selected delay setting in the operating data structure 233. In some embodiments block 605 may be performed in part by the controller 230 in conjunction with the manufacturing device.

It will be understood by those of skill in the art that the functions and operations disclosed in the various block diagrams, flowcharts, and examples provided herein may be implemented by a range of hardware, software, firmware, and combinations thereof. Portions of the subject matter described herein may be implemented via Application Specific Integrated Circuits (ASICs), Field Programmable Gate Arrays (FPGAs), digital signal processors (DSPs), or other integrated formats. Portions of the subject matter described herein may also be implemented via integrated circuits and/or as one or more computer programs running on one or more computers. Designing the circuitry and/or writing the code for the software and or firmware is within the skill of one skilled in the art in light of this disclosure.

While certain example techniques have been described and shown herein using various methods, devices and systems, it should be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

The invention claimed is:

1. A precision delay line instrument, comprising:
   a plurality of controller activatable delay loops comprising a plurality of different delay length design values, wherein the plurality of different delay length design values comprise a first set of delay lengths according to a first set of binary step values, and a second set of delay lengths according to a second set of binary step values that is offset from the first set of binary step values;
   an operating data structure comprising a set of selectable delay settings for the precision delay line instrument, and identifications of delay loops corresponding to each of the selectable delay settings, wherein the identified delay loops corresponding to at least one of the selectable delay settings comprise a best-fit matched combination of delay loops, wherein the best-fit matched combination of delay loops produces a signal delay by the delay line instrument that more closely matches the at least one selectable delay setting, as compared to other combinations of delay loops producible by the delay line instrument, said other combinations of delay loops including a combination of delay loops selected according to the delay length design values; and a controller communicatively coupled to the plurality of delay loops, and configured to apply a selected delay setting by accessing the operating data structure and activating the delay loops corresponding to the selected delay setting in the operating data structure.

2. The precision delay line instrument of claim 1, wherein each of the plurality of controller activatable delay loops comprises a neutral side, a delay side, and a controller activatable switch, wherein the contoller activatable switch routes a signal path to either the neutral side or the delay side of a corresponding controller activatable delay loop, and wherein activating a delay loop comprises activating a controller activatable switch to route a signal path to a delay side of a delay loop.

3. The precision delay line instrument of claim 2, wherein the controller activatable switch comprises one or more diodes.

4. The precision delay line instrument of claim 1, wherein the plurality of different delay length design values comprise a first set of delay lengths including 1 picosecond (ps), 2 ps, 4 ps, and 8 ps delay lengths, and a second set of delay lengths including 5 ps, 10 ps, 20 ps, and 40 ps delay lengths.

5. The precision delay line instrument of claim 1, wherein identifications of delay loops corresponding to each of the selectable delay settings comprise best-fit matched combinations of delay loops that produce signal delays by the delay line instrument that most closely match the corresponding selectable delay settings, as compared to other combinations of delay loops producible by the delay line instrument.

6. The precision delay line instrument of claim 1, wherein identifications of delay loops corresponding to each of the selectable delay settings comprise best-fit matched combinations of delay loops that produce signal delays by the delay line instrument that most closely match the corresponding selectable delay settings, as compared to every possible combination of delay loops producible by the delay line instrument.

7. The precision delay line instrument of claim 1, further comprising a signal input interface coupled to an input side of the plurality of delay loops, and a signal output interface coupled an output side of the plurality of delay loops.

8. The precision delay line instrument of claim 7, wherein one or more of the signal input interface and signal output interface comprises a coaxial Radio Frequency (RF) connector.

9. The precision delay line instrument of claim 1, further comprising a delay sequence data structure configured to receive one or more pre-selected delay settings, and wherein the controller is configured to apply a pre-selected delay setting from the delay sequence data structure, in response to a received trigger signal.

10. The precision delay line instrument of claim 9, wherein the controller is configured to apply a sequence of pre-selected delay settings from the delay sequence data structure, in response to a sequence of received trigger signals.

11. The precision delay line instrument of claim 9, further comprising an external trigger interface coupled to the controller.

12. The precision delay line instrument of claim 1, wherein the controller is coupled to one or more inputs configured to receive selected delay settings.

13. The precision delay line instrument of claim 12, wherein the one or more inputs comprise a keypad.

14. The precision delay line instrument of claim 12, wherein the one or more inputs comprise a data signal input that is communicatively couplable with a programmable electronic device.

15. The precision delay line instrument of claim 14, wherein the one or more inputs comprise an Ethernet port.

16. A precision delay line instrument, comprising:
a signal input interface coupled to an input side of a plurality of controller activatable delay loops, and a signal output interface coupled to an output side of the plurality of controller activatable delay loops;

a plurality of controller activatable delay loops, wherein each of the plurality of controller activatable delay loops comprises a neutral side, a delay side, and a controller activatable diode switch, wherein the controller activatable diode switch routes a signal path to either the neutral side or the delay side of a corresponding controller activatable delay loop, and wherein activating a delay loop comprises activating a controller activatable diode switch to route a signal path to a delay side of a delay loop;

wherein the plurality of controller activatable delay loops comprises a plurality of different delay length design values, and wherein the plurality of different delay length design values comprises a first set of delay lengths according to a first set of binary step values, and a second set of delay lengths according to a second set of binary step values that is offset from the first set of binary step values;

an operating data structure comprising a set of selectable delay settings for the precision delay line instrument, and identifications of delay loops corresponding to each of the selectable delay settings, wherein the identified delay loops corresponding to each of the selectable delay settings comprise best-fit matched combinations of delay loops, wherein the best-fit matched combinations of delay loops produce signal delays by the delay line instrument that most closely match corresponding selectable delay settings, as compared to all other combinations of delay loops producible by the delay line instrument; and a controller communicatively coupled to the plurality of delay loops, and configured to apply a selected delay setting by accessing the operating data structure and activating the delay loops corresponding to the selected delay setting in the operating data structure.

17. A method of manufacturing a precision delay line instrument, the precision delay line instrument comprising a plurality of delay loops and a controller, wherein the plurality of delay loops comprises a plurality of different delay length design values, wherein the plurality of different delay length design values comprise a first set of delay lengths according to a first set of binary step values, and a second set of delay lengths according to a second set of binary step values that is offset from the first set of binary step values, and wherein the controller is configured to selectively activate the delay loops, the method comprising:

measuring a plurality of combinations of activated delay loops, wherein each combination of activated delay loops is measured by activating one or more selected delay loops and measuring a corresponding signal delay produced by the delay line instrument;

storing measurement results in a measurement results data structure, the measurement results comprising identifications of activated delay loops included in each measured combination of activated delay loops and the corresponding signal delays produced by the delay line instrument;

best-fit matching the signal delays in the measurement results data structure with a desired set of selectable delay settings for the precision delay line instrument, by determining a signal delay in the measurement results data structure that most closely matches each of the delay settings in the desired set of selectable delay settings;

building an operating data structure for the precision delay line instrument, the operating data structure comprising the desired set of selectable delay settings for the precision delay line instrument, and the identifications of activated delay loops from the measurement results data structure that correspond to the best-fit matched signal delays for each of the selectable delay settings; and storing the operating data structure in a memory location accessible by the controller, wherein the controller is configured to apply a selected delay setting by accessing the operating data structure and activating the delay loops corresponding to the selected delay setting in the operating data structure.

18. The method of manufacturing a precision delay line instrument of claim 17, wherein each of the plurality of delay loops comprises a neutral side, a delay side, and a controller activatable switch, wherein the controller activatable switch routes a signal path to either the neutral side or the delay side of a corresponding controller activatable delay loop, and wherein activating a delay loop comprises activating a controller activatable switch to route a signal path to a delay side of a delay loop.

19. The method of manufacturing a precision delay line instrument of claim 18, wherein the controller activatable switch comprises one or more diodes.

\* \* \* \* \*